US012624439B2

(12) United States Patent
Yoshimatsu

(10) Patent No.: US 12,624,439 B2
(45) Date of Patent: May 12, 2026

(54) λ-Ti$_3$O$_5$ FILM FORMING SUBSTRATE AND METHOD FOR PRODUCING λ-Ti$_3$O$_5$ FILM FORMING SUBSTRATE

(71) Applicant: TOHOKU UNIVERSITY, Sendai (JP)

(72) Inventor: Kohei Yoshimatsu, Sendai (JP)

(73) Assignee: TOHOKU UNIVERSITY, Sendai (JP)

( * ) Notice: Subject to any disclaimer, the term of this patent is extended or adjusted under 35 U.S.C. 154(b) by 0 days.

(21) Appl. No.: 18/688,977

(22) PCT Filed: Sep. 6, 2022

(86) PCT No.: PCT/JP2022/033363
§ 371 (c)(1),
(2) Date: Mar. 4, 2024

(87) PCT Pub. No.: WO2023/033182
PCT Pub. Date: Mar. 9, 2023

(65) Prior Publication Data
US 2025/0129466 A1 Apr. 24, 2025

(30) Foreign Application Priority Data

Sep. 6, 2021 (JP) ................................. 2021-144696

(51) Int. Cl.
*B32B 15/04* (2006.01)
*B32B 17/06* (2006.01)
*C23C 14/08* (2006.01)
*C23C 14/28* (2006.01)
(52) U.S. Cl.
CPC ........... *C23C 14/083* (2013.01); *C23C 14/28* (2013.01)

(58) Field of Classification Search
CPC ...................................................... C23C 14/08
USPC .................................................. 428/701, 702
See application file for complete search history.

(56) References Cited

U.S. PATENT DOCUMENTS

2019/0185338 A1* 6/2019 Nakamura .............. C04B 35/46
2019/0285489 A1* 9/2019 Nakamura .............. B32B 5/022

FOREIGN PATENT DOCUMENTS

CN 110071122 A 7/2019
JP 2011241137 A 12/2011

OTHER PUBLICATIONS

Chen et al, "Non-metallic electrical transport properties of a metastable λ-Ti3O5 thin film epitaxially stabilized on a pseudobrookite seed layer", Applied Physics Letters, vol. 116, May 20, 2020, 5 pages.
Hakeo et al, "Dielectric and optical constraints of λ-Ti3O5 film measured by spectroscopic ellipsometry", Materials Letters, Sep. 22, 2016, vol. 188, pp. 8-12.
International Search Report (with English translation) received in corresponding Application No. PCT/JP2022/033363, dated Nov. 1, 2022, 6 pages.

(Continued)

*Primary Examiner* — Lauren R Colgan
(74) *Attorney, Agent, or Firm* — Dority & Manning, P.A.

(57) ABSTRACT

A λ-Ti$_3$O$_5$ film forming substrate includes a support substrate and a λ-Ti$_3$O$_5$ film formed directly on the support substrate.

4 Claims, 12 Drawing Sheets

(56)          References Cited

OTHER PUBLICATIONS

Ohkoshi et al, "Synthesis of a metal oxide with a room-temperature photoreversible phase transition", Nature Chemistry, vol. 2, Jul. 2010, pp. 539-545.
Ould-Hamouda et al, "Single-shot time resolved study of the photo-reversible phase transition induced in flakes of Ti3O5 nanoparticles at room temperature", Chemical Physics Letters, 608, 2014, pp. 106-112.
Yoshimatsu et al, "Direct Synthesis of Metastable λ-Phase Ti3O5 Fils on LaAIO3 (110) Substrates at High Temperatures", Crystal Growth & Design, Dec. 15, 2021, 22, 1, pp. 703-710.

* cited by examiner

FIG. 12

λ-Ti$_3$O$_5$ FILM FORMING SUBSTRATE AND METHOD FOR PRODUCING λ-Ti$_3$O$_5$ FILM FORMING SUBSTRATE

CROSS-REFERENCE TO RELATED APPLICATIONS

This application is the U.S. National Stage entry of International Application No. PCT/JP2022/033363, filed on Sep. 6, 2022, which, in turn, claims priority to Japanese Patent Application No. 2021-144696, filed on Sep. 6, 2021, both of which are hereby incorporated herein by reference in their entireties for all purposes.

TECHNICAL FIELD

The present disclosure relates to a λ-Ti$_3$O$_5$ film forming substrate and a method for producing the λ-Ti$_3$O$_5$ film forming substrate.

BACKGROUND ART

Trititanium pentoxide (hereinafter, may be referred to as Ti$_3$O$_5$) is an oxide material having many crystal polymorphisms such as an α-phase, a β-phase, a γ-phase, a δ-phase, and a λ-phase. λ-type Ti$_3$O$_5$ (hereinafter, may be referred to as λ-Ti$_3$O$_5$) consisting of the λ-phase undergoes a phase transition into the α-phase or the β-phase by heat, light, or pressure. Particularly, the λ-Ti$_3$O$_5$ undergoes a reversible transition between the λ-phase and the β-phase by a nanosecond pulsed laser, and exhibits a photo-induced phase transition under visible light. Therefore, the λ-Ti$_3$O$_5$ is expected to be applied to an optical recording medium.

As a method for producing λ-Ti$_3$O$_5$, NPL 1 discloses a method for producing reduction-sintered SiO$_2$-coated λ-Ti$_3$O$_5$ nanoparticles by using a reverse micelle method and a sol-gel method.

Since the λ-Ti$_3$O$_5$ is a metastable phase, the size of a crystal is limited to a nanometer order. In a large crystal, the β-phase is most stable, and it is difficult to obtain λ-Ti$_3$O$_5$. In the method described in NPL 1, enlarging of crystals is suppressed by coating with SiO$_2$. However, in the method described in NPL 1, a process such as chemical etching with SiO$_2$ is necessary.

As a method for producing the λ-Ti$_3$O$_5$ in which the chemical etching with SiO$_2$ is not necessary, NPL 2 discloses a technology of forming MgTi$_2$O$_5$ as a seed layer on LaAlO$_3$, and forming the λ-Ti$_3$O$_5$ film on the seed layer.

CITATION LIST

Non Patent Literature

NPL 1: S. Ohkoshi et al., Nature Chem. 2, 539 (2010)
NPL 2: H. Chen et al., Appl. Phys. Lett. 116, 201904 (2020)
NPL 3: A. Ould-Hamouda et al., Chem. Phys. Lett. 608, 106-112 (2014)

SUMMARY OF INVENTION

Technical Problem

When the seed layer exists between the λ-Ti$_3$O$_5$ film and the substrate as in NPL 2, a component of the seed layer diffuses into the λ-Ti$_3$O$_5$ film, and the λ-phase is stabilized, and thus a phase transition into the β-phase is not exhibited. This has a problem when considering application to the optical recording medium.

The present invention has been made in consideration of such circumstances, and an object thereof is to provide a λ-Ti$_3$O$_5$ film forming substrate including a λ-Ti$_3$O$_5$ film that is formed directly on the substrate and is capable of stably transitioning from λ-Ti$_3$O$_5$ into another phase, and a method for producing the λ-Ti$_3$O$_5$ film forming substrate.

Solution to Problem

To solve the problem, the invention suggests the following means.

<1> A λ-Ti$_3$O$_5$ film forming substrate according to an aspect of the invention includes a support substrate; and a λ-Ti$_3$O$_5$ film provided directly on the support substrate.

<2> In the λ-Ti$_3$O$_5$ film forming substrate according to <1>, in thin film X-ray diffraction, when performing measurement at a position where a diffraction intensity $A_{203}$ of a (203) plane of the λ-Ti$_3$O$_5$ film becomes maximum, an intensity ratio $A_{203}/A_{20\text{-}3}$ between the diffraction intensity $A_{203}$ and a diffraction intensity $A_{20\text{-}3}$ of a (20-3) plane may be 10 or more.

<3> In the λ-Ti$_3$O$_5$ film forming substrate according to <2>, in the thin film X-ray diffraction, when performing measurement at a position after the λ-Ti$_3$O$_5$ film forming substrate is rotated by 180° from the position where the diffraction intensity $A_{203}$ becomes maximum, an intensity ratio $A_{20\text{-}3}/A_{203}$ between the diffraction intensity $A_{20\text{-}3}$ and the diffraction intensity $A_{203}$ may be 10 or more.

<4> In the λ-Ti$_3$O$_5$ film forming substrate according to any one of <1> to <3>, the support substrate may be a (110) plane LaAlO$_3$.

<5> In the λ-Ti$_3$O$_5$ film forming substrate according to any one of <1> to <4>, a component of the support substrate may substantially not diffuse to the λ-Ti$_3$O$_5$ film.

<6> In the λ-Ti$_3$O$_5$ film forming substrate according to any one of <1> to <5>, when a position spaced apart from an interface between the support substrate and the λ-Ti$_3$O$_5$ film toward a surface of the λ-Ti$_3$O$_5$ film by 10 nm in a plate thickness direction is set as a position A, and a position of a surface of the λ-Ti$_3$O$_5$ film is set as a position B, in a region from the position A to the position B in a plate thickness direction, an element X contained in the support substrate may be 0.1 atomic % or less with respect to all elements in the λ-Ti$_3$O$_5$ film.

<7> A method for producing a λ-Ti$_3$O$_5$ film forming substrate according to another aspect of the invention may include forming a λ-Ti$_3$O$_5$ film on a support substrate heated to a temperature region higher than 1000° C. and lower than 1200° C. by a physical vapor deposition method.

<8> In the method for producing a λ-Ti$_3$O$_5$ film forming substrate according to <7>, the support substrate may be a (110) plane LaAlO$_3$.

<9> In the method for producing a λ-Ti$_3$O$_5$ film forming substrate according to <7> or <8>, the temperature region may be from 1050° C. to 1150° C.

<10> In the method for producing a λ-Ti$_3$O$_5$ film forming substrate according to any one of <7> to <9>, the physical vapor deposition method may be a pulsed laser deposition method.

<11> In the method for producing a $\lambda$-Ti$_3$O$_5$ film forming substrate according to <10>, a pressure of an Ar gas when forming the $\lambda$-Ti$_3$O$_5$ film may be from $1\times10^{-5}$ Torr to $1\times10^{-3}$ Torr.

Advantageous Effects of Invention

According to the aspect of the invention, it is possible to provide a $\lambda$-Ti$_3$O$_5$ film forming substrate including a $\lambda$-Ti$_3$O$_5$ film that is formed directly on the substrate and is capable of stably transitioning from $\lambda$-Ti$_3$O$_5$ into another phase, and a method for producing the $\lambda$-Ti$_3$O$_5$ film forming substrate.

BRIEF DESCRIPTION OF DRAWINGS

FIG. 12 is a view illustrating a relationship between an intensity and a depth of each element of the substrate of Example 1.

DESCRIPTION OF EMBODIMENTS

In the producing method described in NPL 2, the $\lambda$-Ti$_3$O$_5$ film cannot be formed directly on the substrate, and the $\lambda$-Ti$_3$O$_5$ film is formed through a seed layer. The present inventors have made a thorough investigation on a method for forming the $\lambda$-Ti$_3$O$_5$ film directly on the substrate without through the seed layer. As a result, they obtained a finding that it is most important to control a temperature of the substrate during film formation for direct formation of the $\lambda$-Ti$_3$O$_5$ film. Specifically, they have found that the $\lambda$-Ti$_3$O$_5$ film can be formed directly on the substrate by controlling the temperature of the substrate to be higher than 1000° C. and lower than 1200° C. The invention is completed on the basis of the findings.

($\lambda$-Ti$_3$O$_5$ Film Forming Substrate)

Hereinafter, description will be given of a $\lambda$-Ti$_3$O$_5$ film forming substrate according to an embodiment of the invention with reference to the accompanying drawings. Note that, for convenience, the drawings used in the following description may illustrate characteristic portions in an enlarged manner for easy understanding of characteristics, and it cannot be said that dimension ratios and the like of respective constituent elements are the same as actual dimension ratios and the like. In addition, materials, dimensions, and the like exemplified in the following description are illustrative only, the invention is not limited thereto, and the invention can be implemented with appropriate modifications within a range not departing from the gist of the invention.

Figure 1:
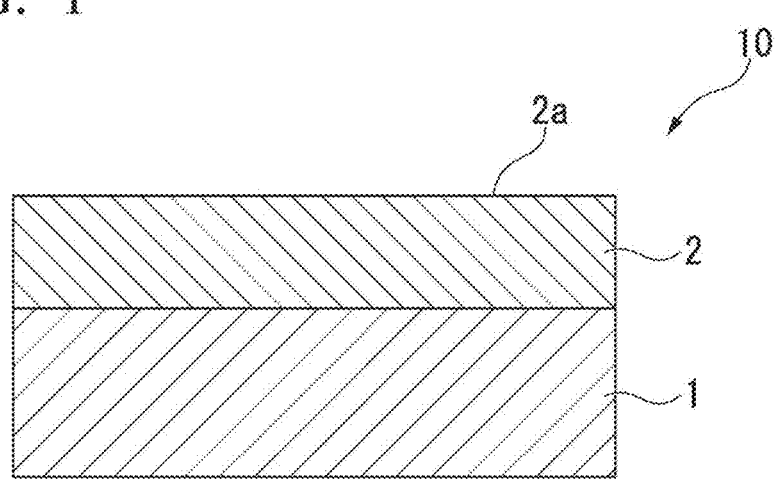
FIG. 1 is a schematic cross-sectional view illustrating a $\lambda$-Ti$_3$O$_5$ film forming substrate according to an embodiment of the invention.

FIG. 1 is a schematic cross-sectional view of a $\lambda$-Ti$_3$O$_5$ film forming substrate according to an embodiment of the invention. A $\lambda$-Ti$_3$O$_5$ film forming substrate 10 according to this embodiment includes a support substrate 1, and a $\lambda$-Ti$_3$O$_5$ film 2 disposed directly on the support substrate 1.

(Support Substrate)

The support substrate 1 is not particularly limited as long as the $\lambda$-Ti$_3$O$_5$ film 2 can be formed on the support substrate 1. Examples of a material of the support substrate 1 include lanthanum aluminate (LaAlO$_3$), neodymium aluminate (NdAlO$_3$), yttrium aluminate (YAlO$_3$), LSAT ((LaAlO$_3$)$_{0.3}$—(SrAl$_{0.5}$Ta$_{0.5}$O$_3$)$_{0.7}$), strontium titanate (SrTiO$_3$), and the like. From the viewpoint of matching between an a-axis length, a b-axis length, and a c-axis length of the $\lambda$-Ti$_3$O$_5$ film, and surface lattice constants of the substrate, as the substrate, a (110) plane LaAlO$_3$ substrate (LaAlO$_3$ (110) substrate) is preferable.

($\lambda$-Ti$_3$O$_5$ Film)

Figure 2:
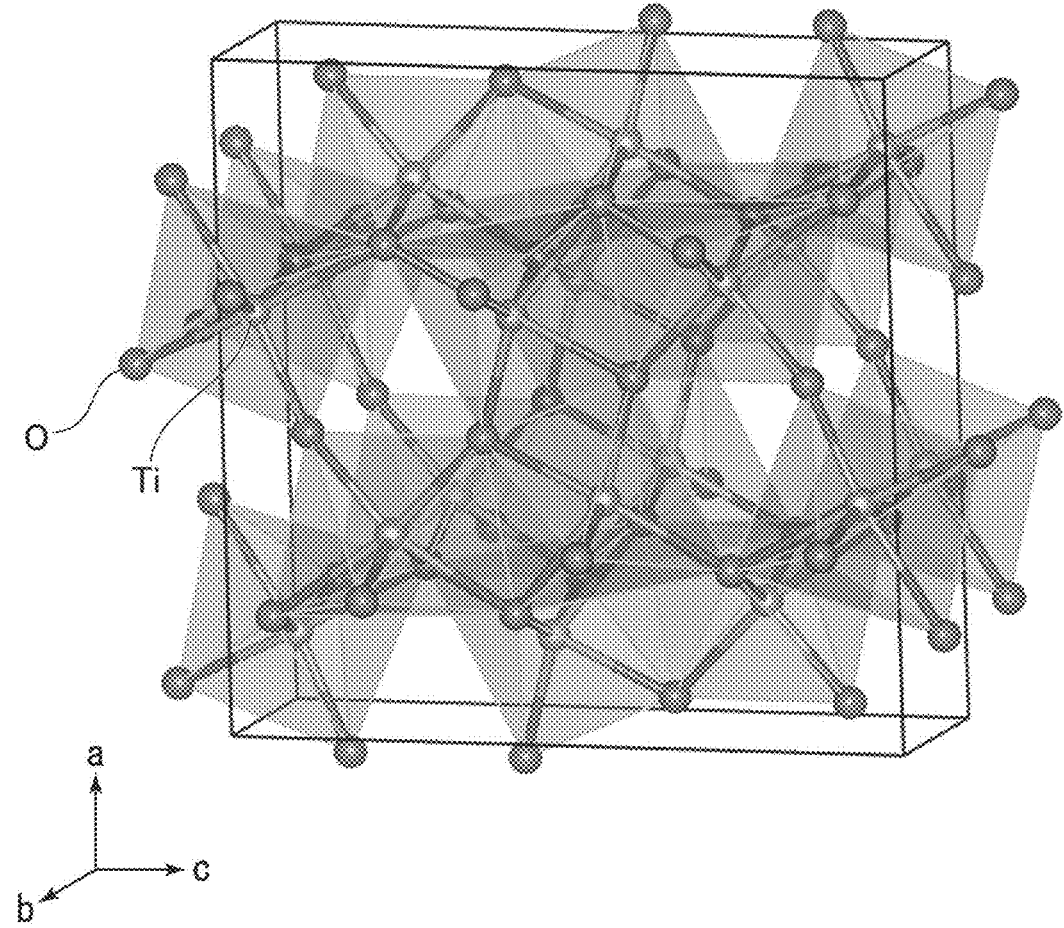
FIG. 2 is a view illustrating a crystal structure of $\lambda$-Ti$_3$O$_5$.

The $\lambda$-Ti$_3$O$_5$ film 2 is provided directly on the support substrate 1. The $\lambda$-Ti$_3$O$_5$ film 2 is a film consisting of a single crystal of $\lambda$-Ti$_3$O$_5$ in a $\lambda$-phase. As shown in FIG. 2, the $\lambda$-Ti$_3$O$_5$ is Ti$_3$O$_5$ in which a crystal structure pertains to C2/m, and lattice constants are a=9.8378 (5) Å, b=3.78674 (11) Å, c=9.9707 (3) Å, $\beta$=91.257 (3)°. Numbers in parentheses are error values for the last digit. Whether or not the $\lambda$-Ti$_3$O$_5$ is a single crystal can be confirmed, for example, by X-ray diffraction. Specifically, confirmation can be made by presence or absence of a diffraction peak derived from the $\lambda$-Ti$_3$O$_5$, and a diffraction peak derived from another phase.

In thin film X-ray diffraction, when performing measurement at a position where a diffraction intensity $A_{203}$ of a (203) plane of the $\lambda$-Ti$_3$O$_5$ film 2 becomes maximum, an intensity ratio $A_{203}/A_{20-3}$ between the diffraction intensity $A_{203}$ of a (203) plane and a diffraction intensity $A_{20-3}$ of a (20-3) plane of the $\lambda$-Ti$_3$O$_5$ film 2 is preferably 10 or more. More preferably, the intensity ratio $A_{203}/A_{20-3}$ is 50 or more. Still more preferably, the intensity ratio $A_{203}/A_{20-3}$ is 100 or more. When the intensity ratio $A_{203}/A_{20-3}$ is 10 or more, a rotational domain of the crystal is reduced, and a stable phase transition is observed.

In the thin film X-ray diffraction, when performing measurement at a position (hereinafter, may be referred to as $\phi$180°) after the $\lambda$-Ti$_3$O$_5$ film forming substrate 10 is rotated by 180° from the position (hereinafter, may be referred to as $\phi$0°) where the diffraction intensity $A_{203}$ becomes maximum, an intensity ratio $A_{20-3}/A_{203}$ between the diffraction intensity $A_{20-3}$ of the (20-3) plane and the diffraction intensity $A_{203}$ of the (203) plane of the $\lambda$-Ti$_3$O$_5$ film 2 is preferably 10 or more. More preferably, the intensity ratio $A_{20-3}/A_{203}$ is 50 or more. Still more preferably, the intensity ratio $A_{20-3}/A_{203}$ is 100 or more. When the intensity ratio $A_{20-3}/A_{203}$ is 10 or more, a rotational domain of the crystal is reduced, and a stable phase transition is observed.

Figure 3:
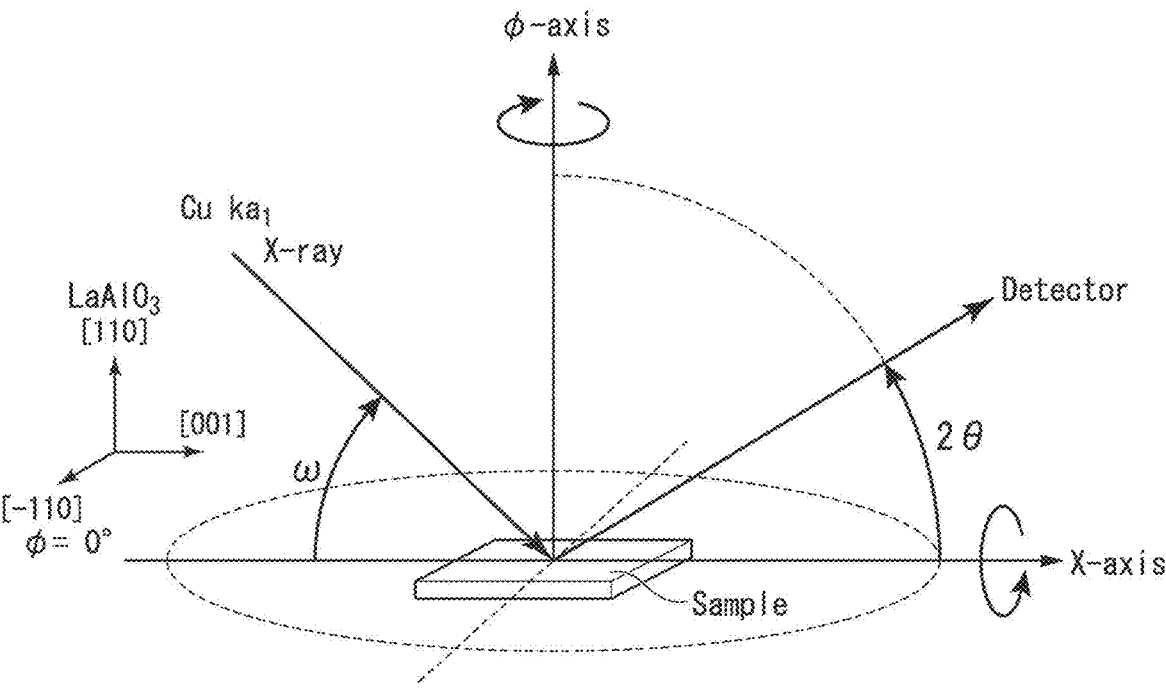
FIG. 3 is a view illustrating arrangement of a sample in thin film X-ray diffraction.

Next, description will be given of a method of measuring thin film X-ray diffraction. FIG. 3 is a view illustrating arrangement of a sample in the thin film X-ray diffraction. A φ-axis in FIG. 3 is an in-plane rotational axis (axis orthogonal to a sample surface) of a stage in which a sample is installed. An ω-axis is an axis for controlling an angle of an X-ray incident on the sample surface through control of a posture of a sample or an X-ray source. A x-axis is an axis (tilt operation axis) orthogonal to the ω-axis and the φ-axis. The φ-axis, the ω-axis, and the x-axis are orthogonal to each other. An angle ω=θ is an angle of an X-ray incident to the sample from the X-ray source. When a diffracted X-ray is emitted when the X-ray is incident to the sample at an incidence angle θ, an angle 2θ of the diffracted X-ray with respect to the incident X-ray becomes two times the θ.

In the thin film X-ray diffraction, an axis that is orthogonal to the surface of the λ-Ti$_3$O$_5$ film forming substrate 10 and passes through the center of the λ-Ti$_3$O$_5$ film forming substrate 10 becomes the φ-axis. A direction in which a direction connecting an X-ray incidence unit and an X-ray detection unit is projected to the λ-Ti$_3$O$_5$ film 2 is set as a first direction. The X-ray incidence unit is, for example, an X-ray generation unit and an incident optical system element. For example, the X-ray detection unit is a detector and a light-receiving optical element.

In the thin film X-ray diffraction, a [010] direction of the λ-Ti$_3$O$_5$ film 2 is arranged to be parallel to the first direction at φ0°. Note that, in a case where the λ-Ti$_3$O$_5$ film 2 is formed on an LaAlO$_3$ (110) substrate, a [001] direction of the LaAlO$_3$ substrate and a [010] direction of the λ-Ti$_3$O$_5$ film 2 may be arranged to be parallel to the first direction.

When performing the thin film X-ray diffraction measurement of the λ-Ti$_3$O$_5$ film forming substrate 10 with the [010] direction of the λ-Ti$_3$O$_5$ film 2 arranged to be parallel to the first direction, in an X-ray diffraction pattern (XRD pattern), a diffraction peak of a (203) plane or a diffraction peak of a (20-3) plane is shown. Here, a position where the intensity (diffraction intensity) of the diffraction peak of the (203) plane becomes maximum is set as φ0°. When measuring the thin film X-ray diffraction at a position of φ0°, an XRD pattern at the time of φ0° can be obtained. The intensity ratio $A_{203}/A_{20-3}$ can be obtained by analyzing the XRD pattern. In the obtained XRD pattern, the diffraction intensity $A_{203}$ of the (203) plane is an intensity when 2θ is 32.1°. The diffraction intensity $A_{20-3}$ of the (20-3) plane is an intensity when 2θ is 32.9° in the obtained XRD pattern. Note that, the position where the intensity of the diffraction peak of the (203) plane becomes maximum can be set, for example, by the following method. First, a sample is disposed at a position (initial position of 2θ, ω, χ, and φ) that is theoretically expected from a crystal structure and plane indexes of λ-Ti$_3$O$_5$. Then, the position can be set by adjusting 2θ, the ω-axis, the χ-axis, and the φ-axis so that the intensity of the diffraction peak of the (203) plane becomes a maximum value.

A position where the λ-Ti$_3$O$_5$ film forming substrate 10 is rotated by 180° around the axis φ from the position of φ0° is set as φ180°. 2θ, the ω-axis, the χ-axis, and the φ-axis are adjusted so that the intensity of the diffraction peak of the (20-3) plane becomes a maximum value at the position of φ180°. Then, the thin film X-ray diffraction is measured at the position of φ180° to obtain an XRD pattern at the time of φ180°. The intensity ratio $A_{20-3}/A_{203}$ can be obtained by analyzing the XRD pattern.

In a case where the support substrate 1 is an LaAlO$_3$ (110) substrate, the λ-Ti$_3$O$_5$ film 2 preferably has a predetermined crystal orientation. Specifically, in a perpendicular-to-plane direction, [100] of the λ-Ti$_3$O$_5$ film 2 and [110] of LaAlO$_3$ are preferably parallel to each other. In an in-plane direction, [010] of the λ-Ti$_3$O$_5$ film 2 and [001] of LaAlO$_3$ are preferably parallel to each other. In a case where the λ-Ti$_3$O$_5$ film 2 has the orientation, the quality of the λ-Ti$_3$O$_5$ film 2 is improved, and thus this case is preferable. The orientation can be evaluated by the XRD pattern obtained in the thin film X-ray diffraction measurement of the λ-Ti$_3$O$_5$ film forming substrate 10.

The thickness of the λ-Ti$_3$O$_5$ film 2 is not particularly limited. For example, the thickness of the λ-Ti$_3$O$_5$ film 2 is from 1 nm to 1000 nm. The thickness of the λ-Ti$_3$O$_5$ film 2 is more preferably from 1 nm to 500 nm. The thickness of the λ-Ti$_3$O$_5$ film 2 is still more preferably from 1 nm to 200 nm.

In the λ-Ti$_3$O$_5$ film forming substrate 10 according to this embodiment, it is preferable that a component of the support substrate 1 substantially does not diffuse into the Ti$_3$O$_5$ film 2. When the component of the support substrate 1 substantially does not diffuse (the component of the support substrate 1 substantially does not diffuse into the λ-Ti$_3$O$_5$ film 2), in the λ-Ti$_3$O$_5$ film 2, a transition into another phase can be stably performed. Here, whether the component of the support substrate 1 substantially does not diffuse can be determined, for example, from an element mapping image. The element mapping image can be obtained by the following method. The λ-Ti$_3$O$_5$ film forming substrate 10 is processed by a focused ion beam (FIB) and the like, and an obtained cross-section is observed by a scanning transmission electron microscope (STEM). Next, the element mapping image can be obtained by performing element mapping by using an element analyzer (for example, an energy dispersive X-ray analyzer (EDS)) provided in the STEM.

A position spaced apart from an interface between the support substrate 1 and the λ-Ti$_3$O$_5$ film 2 toward a surface of the λ-Ti$_3$O$_5$ film 2 by 10 nm in a plate thickness direction is set as a position A, and a position of a surface of the λ-Ti$_3$O$_5$ film 2 is set as a position B. So as to stably perform a phase transition, in a region from the position A to the position B in the plate thickness direction, an element X contained in the support substrate 1 is preferably 0.1 atomic % or less of all elements in the λ-Ti$_3$O$_5$ film. In the region from the position A to the position B in the plate thickness direction, whether the element X contained in the support substrate 1 is 0.1 atomic % or less of all elements in the λ-Ti$_3$O$_5$ film can be confirmed, for example, by the following method.

The λ-Ti$_3$O$_5$ film forming substrate 10 is processed by the FIB and the like, and an obtained cross-section is observed by the STEM. In an obtained observation image, an EDS spectrum is measured from the support substrate 1 to the λ-Ti$_3$O$_5$ film 2 so that an interface between the support substrate 1 and the λ-Ti$_3$O$_5$ film 2 is included in a plate thickness direction. From the obtained EDS spectrum, a plot in which a position where the interface between the support substrate 1 and the λ-Ti$_3$O$_5$ film 2 is set to 0 nm is set as the horizontal axis, and a spectral intensity of each constituent element is set as the vertical axis is created. Next, the spectral intensity of the constituent element is differentiated at the position by using the obtained plot. Through the differentiation, a differential intensity profile of each element in which the intensity becomes maximum at the interface between the support substrate 1 and the λ-Ti$_3$O$_5$ film 2 is obtained. Fitting is performed on the profile by using a Gaussian function of Expression (1). Here, $\sigma^2$ represents a variance, and x represents a position (nm).

A ratio of element diffusion in the vicinity of the interface between the support substrate 1 and the $\lambda$-Ti$_3$O$_5$ film 2 can be estimated on the basis of $\sigma$ obtained by the above-described method and the Gaussian function in the following Expression (1). For example, 99.7% of entirety of elements fall within a range of positions of $-3\sigma$ to $3\sigma$. On the basis of this idea, in a case where $\sigma$ obtained in a peak of any element is 2.6 nm or less, in a region spaced apart from the interface between the support substrate 1 and the $\lambda$-Ti$_3$O$_5$ film by 10 nm or more, a ratio of the element can be estimated to be 0.1% or less of the entirety of elements. By the above-described method, it can be confirmed that the element X contained in the support substrate 1 is 0.1 atomic % or less of all elements in the $\lambda$-Ti$_3$O$_5$ film. Note that, a value of $\sigma$ of a peak of each element is preferably 2.6 nm or less. The value of $\sigma$ of each element is more preferably 2.0 nm or less. The value of $\sigma$ is still more preferably 1.0 nm or less. Since as the value of $\sigma$ is smaller, diffusion less occurs, the value of $\sigma$ is preferably smaller.

[Mathematical Formula 1]

$$f(x) = \frac{1}{\sqrt{2\pi}\sigma}\exp\left(-\frac{x^2}{2\sigma^2}\right)$$

Expression (1)

(Method for Producing $\lambda$-Ti$_3$O$_5$ Film Forming Substrate)

Next, an example of the method for producing the $\lambda$-Ti$_3$O$_5$ film forming substrate will be described. In the method for producing the $\lambda$-Ti$_3$O$_5$ film forming substrate according to the present disclosure, the $\lambda$-Ti$_3$O$_5$ film 2 is formed on the support substrate 1 by a physical vapor deposition method while controlling the temperature of the support substrate 1 to higher than 1000° C. and lower than 1200° C. Hereinafter, the method for producing the $\lambda$-Ti$_3$O$_5$ film forming substrate of the present disclosure will be described.

Examples of the physical vapor deposition method used in the method for producing the $\lambda$-Ti$_3$O$_5$ film forming substrate of the present disclosure include a pulsed laser deposition method (PLD method), a thermal vapor deposition method, a sputtering method, a molecular beam epitaxy method, and the like. As the physical vapor deposition method, particularly, the PLD method is preferable. Hereinafter, description will be made with reference to the PLD method, but the invention is not limited to the PLD method.

The PLD method is a method in which a substrate and a target that is a material of a thin film are installed in a vacuum chamber, a target surface is irradiated with a high-output pulsed laser to generate a plume (aggregates of atoms, molecules, clusters, and the like) of a high-energy body, and the plume is deposited on an opposing substrate to form a thin film.

Figure 4:
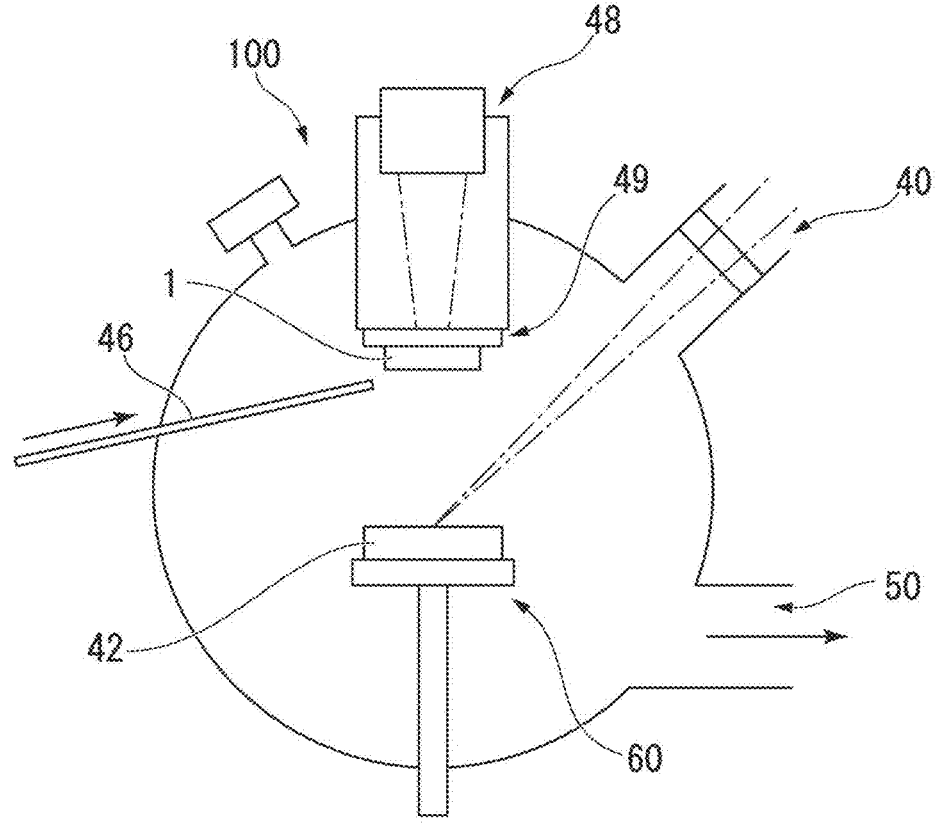
FIG. 4 is a schematic view of a pulsed laser deposition device.

FIG. 4 is a schematic view of a pulsed laser deposition device used in the PLD method. A pulsed laser deposition device 100 includes a laser 40, a target 42, a gas inlet port 46, a heating unit 48, a sample stage 49, a vacuum exhaust port 50, and a vacuum chamber 60.

The support substrate 1 is installed on the sample stage 49. Evacuation is performed from the vacuum exhaust port 50 by using a vacuum pump to create a vacuum state (for example, a pressure of $1\times10^{-6}$ Pa or less). A higher degree of vacuum is preferable. When oxygen and the like remain, reduction may not be possible, and the $\lambda$-Ti$_3$O$_5$ film 2 may not be formed.

Next, the support substrate 1 is heated to a temperature region of higher than 1000° C. and lower than 1200° C. by using the heating unit 48. Note that, the temperature is assumed as a temperature of a surface of the support substrate 1. When the temperature of the support substrate 1 is 1000° C. or lower, a Magneli phase such as Ti$_4$O$_7$ is formed, and the $\lambda$-Ti$_3$O$_5$ film 2 may not be obtained. In a case where the temperature of the support substrate 1 is 1200° C. or higher, a polycrystal is formed, and the single-phase $\lambda$-Ti$_3$O$_5$ film 2 may not be obtained. The temperature of the support substrate 1 is more preferably from 1050° C. to 1150° C.

Typically, as a method of heating the support substrate, a halogen lamp, heating by an infrared laser, and a method using a heat-generating body such as SiC heater can be exemplified. However, an upper limit of a typical substrate temperature is 800° C. at the halogen lamp, and an upper limit temperature of the infrared laser or the SiC heater is 1000° C. In the heating unit 48 of the present disclosure, a temperature of higher than 1000° C. is realized by condensing a heating laser (for example, an infrared laser), but the producing method of the present disclosure is not limited thereto.

Next, a gas is introduced into the vacuum chamber 60 from the gas inlet port 46. In a case where the target is TiO$_2$, it is preferable to flow an Ar gas. A pressure of the Ar gas is preferably from $1\times10^{-5}$ Torr to $1\times10^{-3}$ Torr. Particularly, the pressure of the Ar gas is preferably from $1\times10^{-4}$ Torr to $9\times10^{-4}$ Torr. When the pressure of the Ar gas is lower than $1\times10^{-5}$ Torr, a Magneli phase such as Ti$_4$O$_7$ may be formed. When the pressure of the Ar gas is higher than $1\times10^{-3}$ Torr, Ti$_2$O$_3$ reduced from Ti$_3$O$_5$ may be formed.

In a case where the target is TiO, the gas is preferably O$_2$. A pressure of the O$_2$ gas is, for example, $1\times10^{-6}$ Torr. In a case of the O$_2$ gas, a relationship between the gas pressure and a crystal is opposite to the case of Ar. When the pressure of the O$_2$ gas is raised, an oxidized phase is obtained, and when the gas pressure is lowered, a reduced phase is obtained.

Next, the target 42 is irradiated with the laser 40 to generate plume. The generated plume reaches the support substrate 1 and the $\lambda$-Ti$_3$O$_5$ film is formed. According to this, a $\lambda$-Ti$_3$O$_5$ film forming substrate is obtained. The target 42 is, for example, TiO or TiO$_2$. TiO may be a polycrystalline sintered body or a single crystal. TiO$_2$ may be a polycrystalline sintered body or a single crystal. The laser 40 is not particularly limited as long as the plume is efficiently generated. For example, the laser 40 is a KrF excimer laser (wavelength: 248 nm). Laser irradiation conditions are not particularly limited. For example, an energy density is 1.1 J/cm$^2$, and a frequency is 5 Hz. A film formation rate is not particularly limited. The film formation rate is, for example, 100 nm/hour.

Hereinbefore, the $\lambda$-Ti$_3$O$_5$ film forming substrate of the present disclosure has been described in detail. In addition, the constituent elements in the above-described embodiment can be approximately substituted with known constituent elements within a range not departing from the gist of the invention, and the modification examples may be appropriately combined.

EXAMPLES

Next, examples of the invention will be described, but conditions in the examples are conditional examples employed to confirm executability and an effect of the invention, and the invention is not limited to the conditional examples. The invention can employ various conditions as long as the object of the invention is accomplished without departing from the gist of the invention.

Example 1

Film formation of the $\lambda$-$Ti_3O_5$ film was carried out by a pulsed laser deposition method. An $LaAlO_3$ (110) substrate was used as the substrate, and a single crystal of $TiO_2$ was used as the target. The substrate and the target were installed in a vacuum chamber, and evacuation ($5\times10^{-7}$ Pa) was performed. The surface temperature of the $LaAlO_3$ (110) substrate was heated to 1100° C. by condensing an infrared laser. The Ar gas pressure was set to $1\times10^{-4}$ Torr, and the target was irradiated with a KrF excimer laser (wavelength: 248 nm). As the irradiation conditions, an energy density was set to 1.1 $J/cm^2$ and a frequency was set to 5 Hz. The $\lambda$-$Ti_3O_5$ film was formed on the substrate with a film formation rate set to 100 nm/hour, thereby obtaining a substrate (film thickness: 100 nm) of Example 1.

Comparative Example 1

A $LaAlO_3$ (110) substrate was used as the substrate, and a single crystal of $TiO_2$ was used as the target. The substrate and the target were installed in the vacuum chamber, and evacuation ($5\times10^{-7}$ Pa) was performed. The surface temperature of the $LaAlO_3$ (110) substrate was heated to 1200° C. by condensing an infrared laser. The Ar gas pressure was set to $1\times10^{-4}$ Torr, and the target was irradiated with a KrF excimer laser (wavelength: 248 nm). As the irradiation conditions, an energy density was set to 1.1 $J/cm^2$ and a frequency was set to 5 Hz. A film was formed on the substrate with a film formation rate set to 100 nm/hour, thereby obtaining a substrate (film thickness: 100 nm) of Comparative Example 1.

(Thin Film X-Ray Diffraction Measurement)

Figure 5:
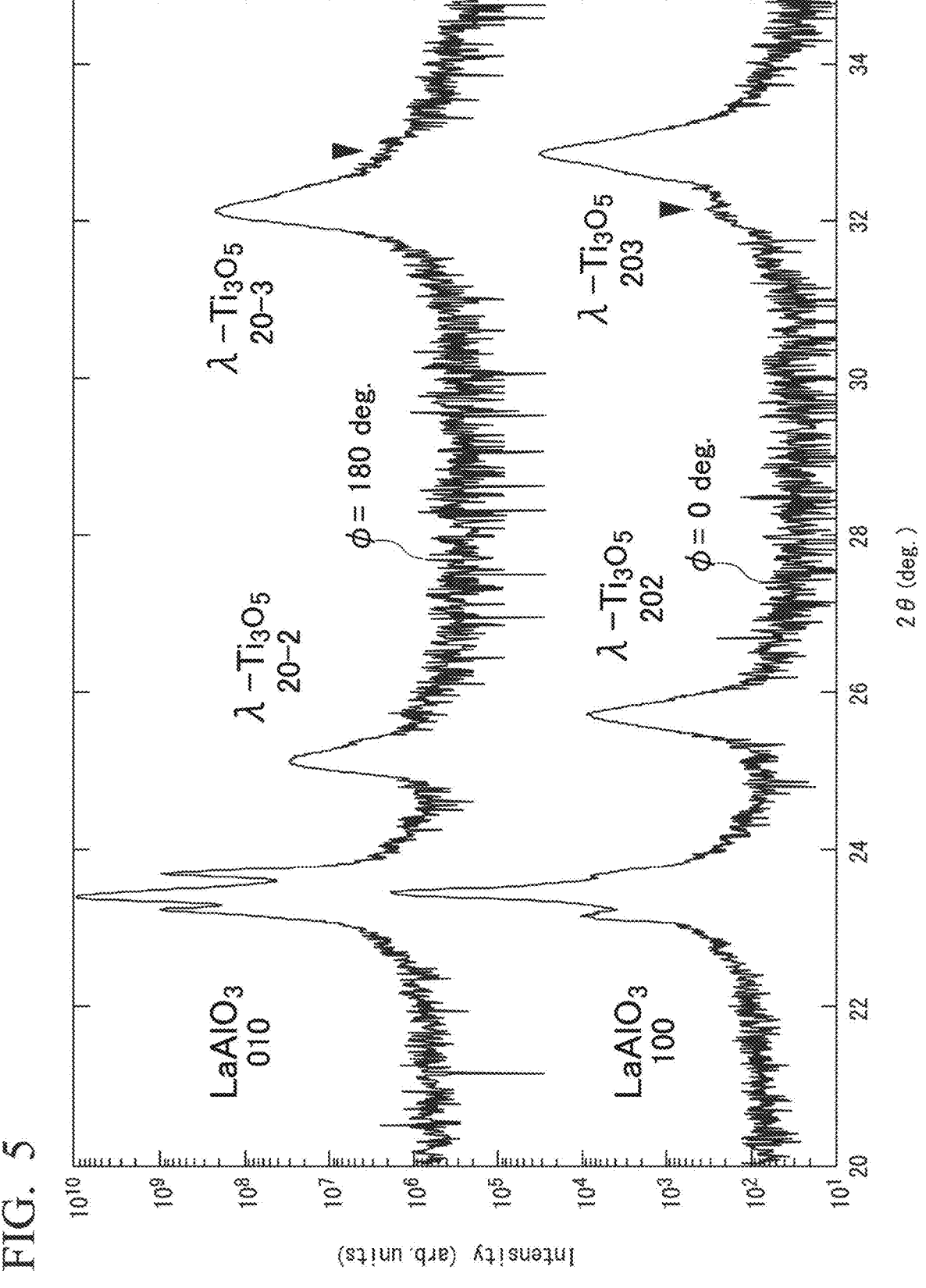
FIG. 5 is an XRD pattern of a substrate of Example 1.
Figure 6:
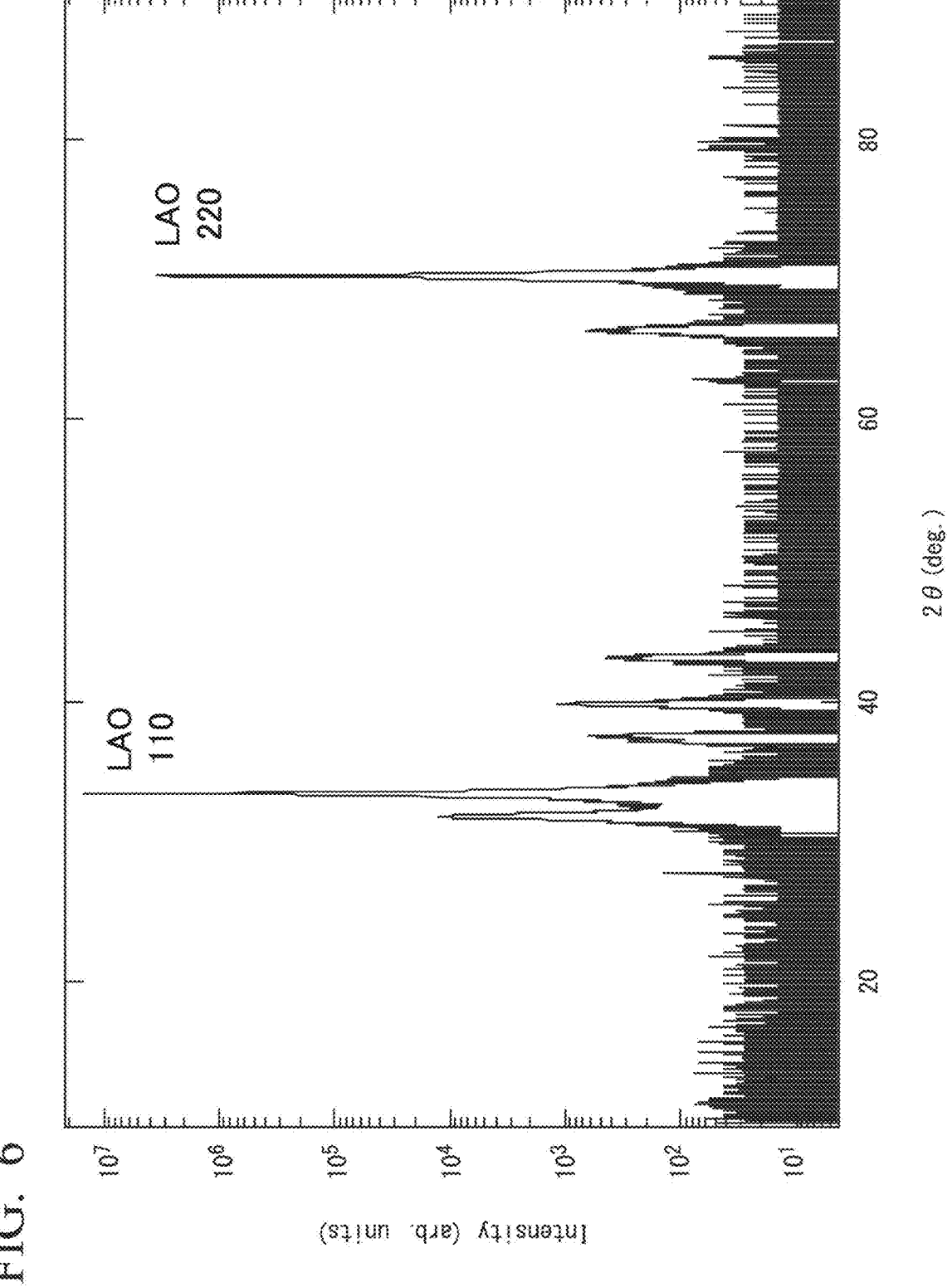
FIG. 6 is an XRD pattern of a substrate of Comparative Example 1.

In the thin film X-ray diffraction measurement, SmartLab (manufactured by Rigaku Corporation) was used. A $CuK\alpha_1$ (wavelength: 1.5406 Å) was used as a radiation source, and measurement was performed at room temperature. Note that, the room temperature was set to from 23° C. to 30° C. The substrate of Example 1 was disposed so that a [010] direction of the $\lambda$-$Ti_3O_5$ film and the $LaAlO_3$ [001], and a direction in which a direction connecting an X-ray incidence unit and an X-ray detection unit is projected to the $\lambda$-$Ti_3O_5$ film become parallel to each other. A position where a diffraction intensity of a (203) plane becomes highest was set as $\omega0°$, a position after rotation around a rotational axis passing through the center of the substrate from the position of $\phi0°$ by 180° was set as $\phi180°$, and the thin film X-ray diffraction measurement was performed at the position of $\phi0°$ and the position of $\phi180°$. Obtained XRD patterns are shown in FIG. 5, and a measurement result on the substrate of Comparative Example 1 is shown in FIG. 6. Diffraction intensities of the (203) plane and the (20-3) plane of the substrate of Example 1, and a ratio thereof are shown in Table 1.

(Raman Measurement)

Figure 7:
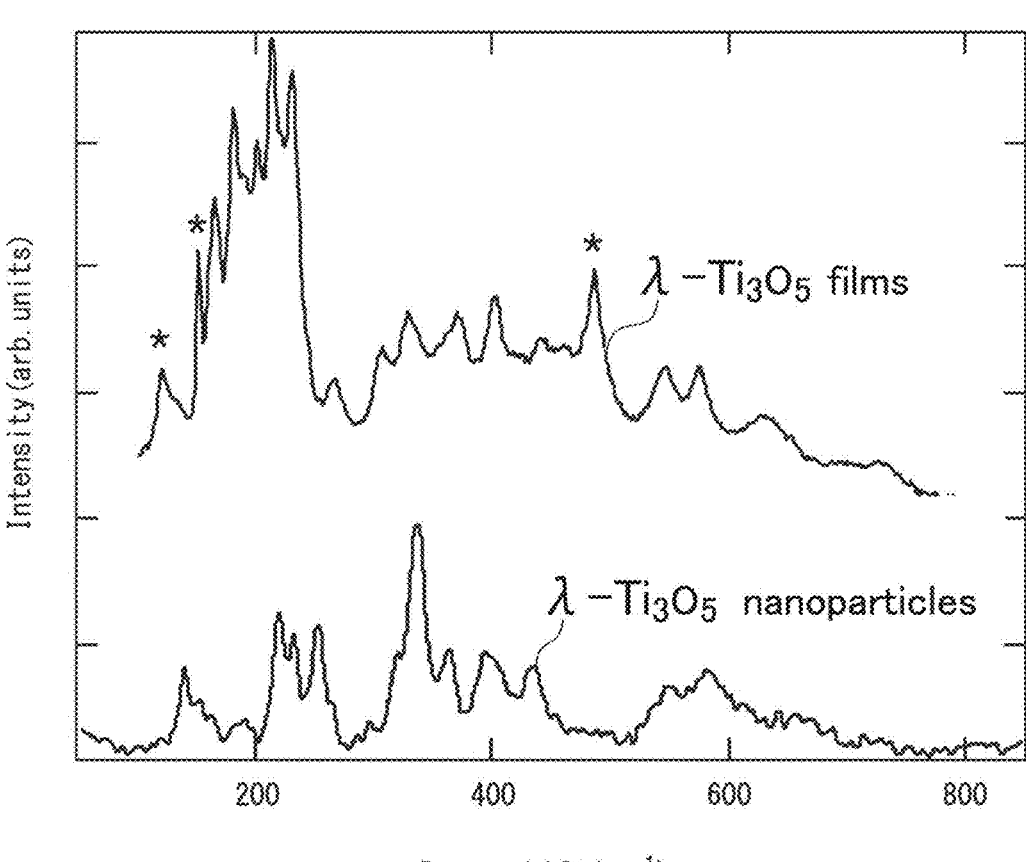
FIG. 7 is a Raman spectrum of the substrate of Example 1, and a Raman spectrum of $\lambda$-Ti$_3$O$_5$ nanoparticles obtained from NPL 3.
Figure 8:
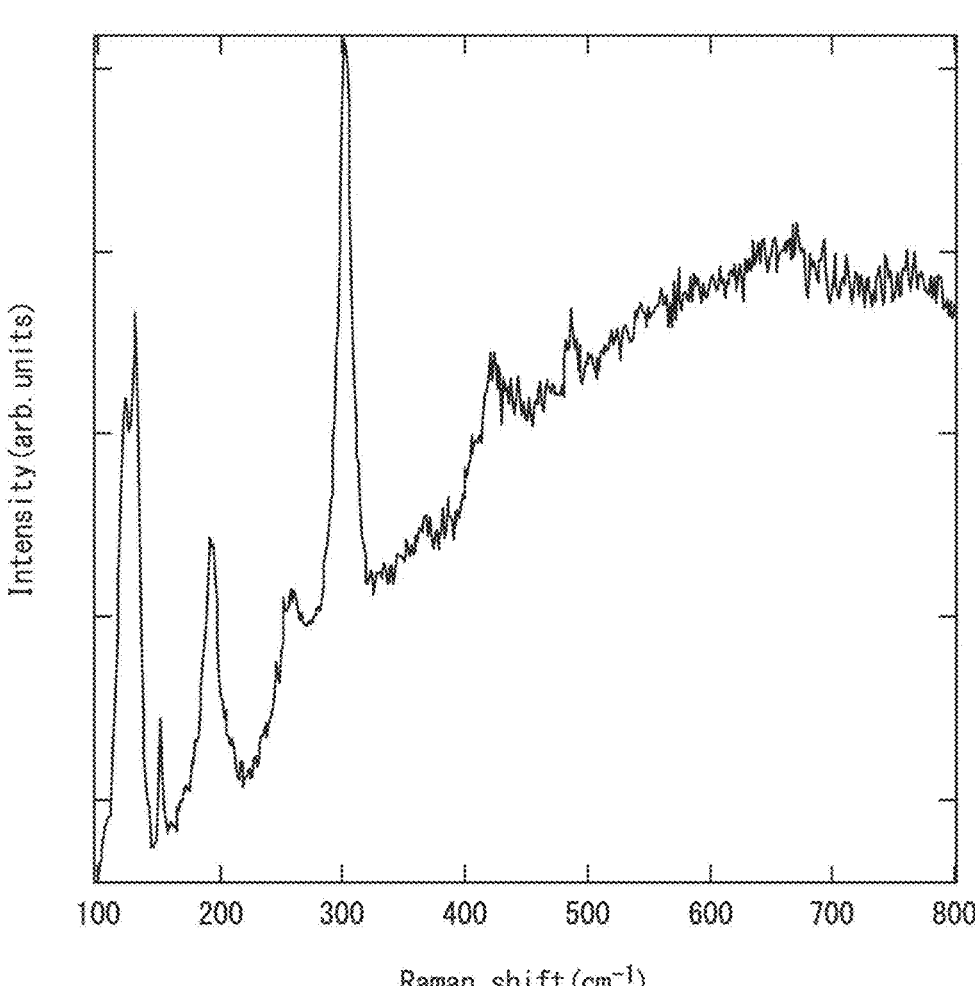
FIG. 8 is a Raman spectrum of the substrate of Comparative Example 1.

Raman measurement on the substrate of Example 1 was performed by using LabRAM HR-800 (manufactured by HORIBA, Ltd.). The laser was an He—Ne laser (wavelength: 633 nm), and measurement was performed at room temperature. Disposition was performed so that an electric field vector of laser light becomes orthogonal to the direction of the $\lambda$-$Ti_3O_5$ film. Obtained results are shown in FIG. 7. FIG. 7 shows a Raman spectrum of the substrate of Example 1 ("$\lambda$-$Ti_3O_5$ films" in FIG. 7), and a Raman spectrum of $\lambda$-$Ti_3O_5$ nanoparticles obtained from NPL 3 ("$\lambda$-$Ti_3O_5$ nanoparticles" in FIG. 7). In addition, a Raman spectrum of the substrate of Comparative Example 1 is shown in FIG. 8.

(Element Mapping)

Figure 9:
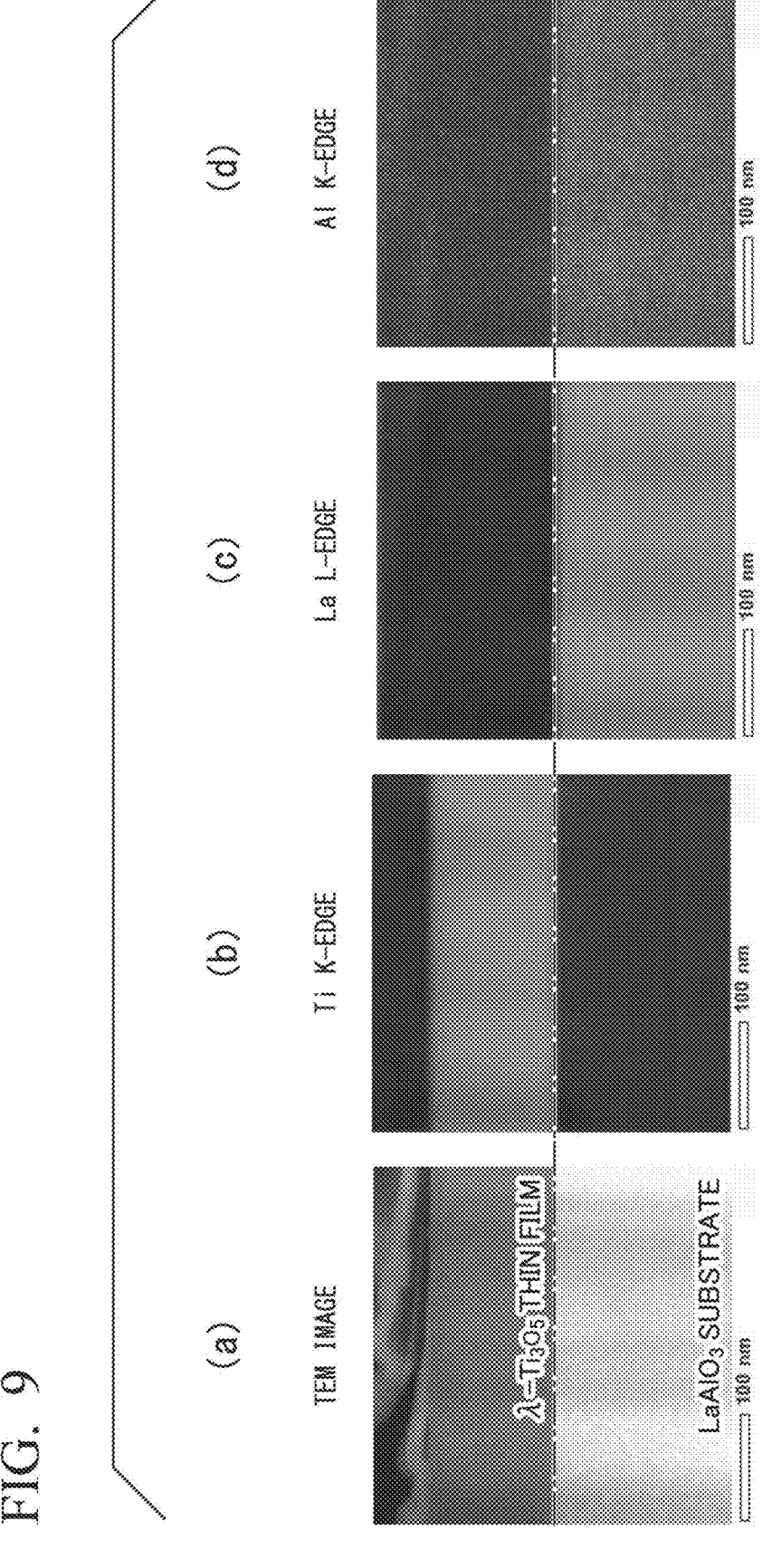
FIG. 9 is an analysis result of element mapping on the substrate of Example 1.

The substrate of Example 1 was processed with FIB. Observation was performed by using a scanning transmission electron microscope, JAM-ARM200F (manufactured by JEOL Ltd.) so as to project a (010) plane and a (001) plane of the $\lambda$-$Ti_3O_5$ film of Example 1. Element mapping was performed on an obtained observation image by using an EDS attached to the scanning transmission electron microscope. Obtained results are shown in FIG. 9.

(Temperature Variation in Resistivity)

Figure 10:
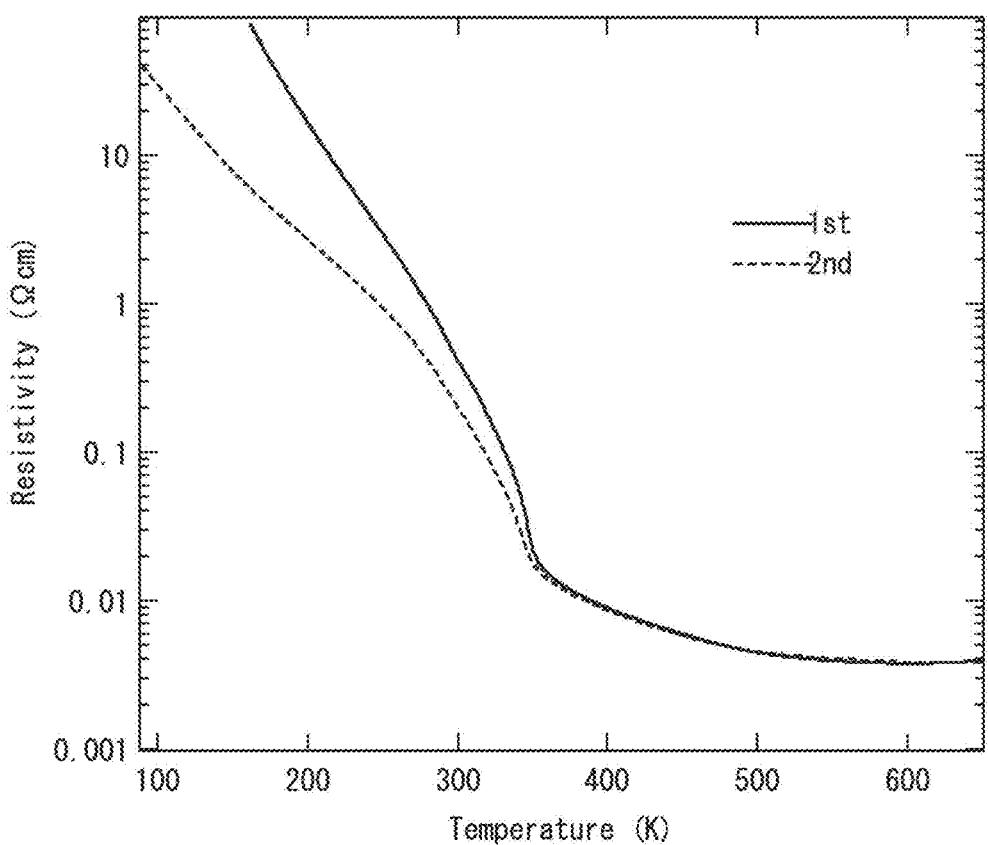
FIG. 10 is a result of temperature variation in resistivity of the substrate of Example 1.

A temperature variation of resistivity of the substrate of Example 1 was measured. Measurement was performed by four-terminal method, and was performed in a temperature range of 10 K to 650 K. Obtained results are shown in FIG. 10.

(Element Diffusion Determination)

Figure 11:
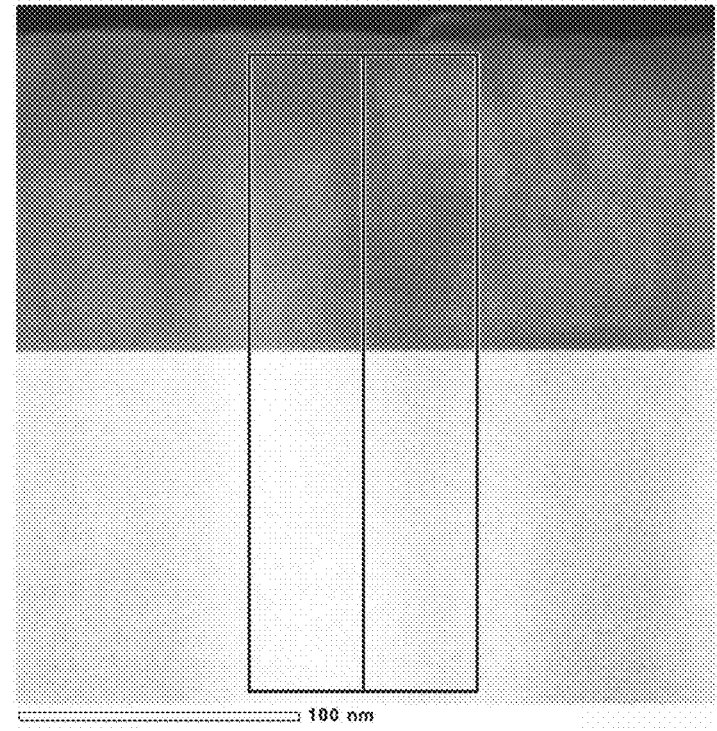
FIG. 11 is a view illustrating a measurement position of EDS measurement on the substrate of Example 1.
Figure 12:
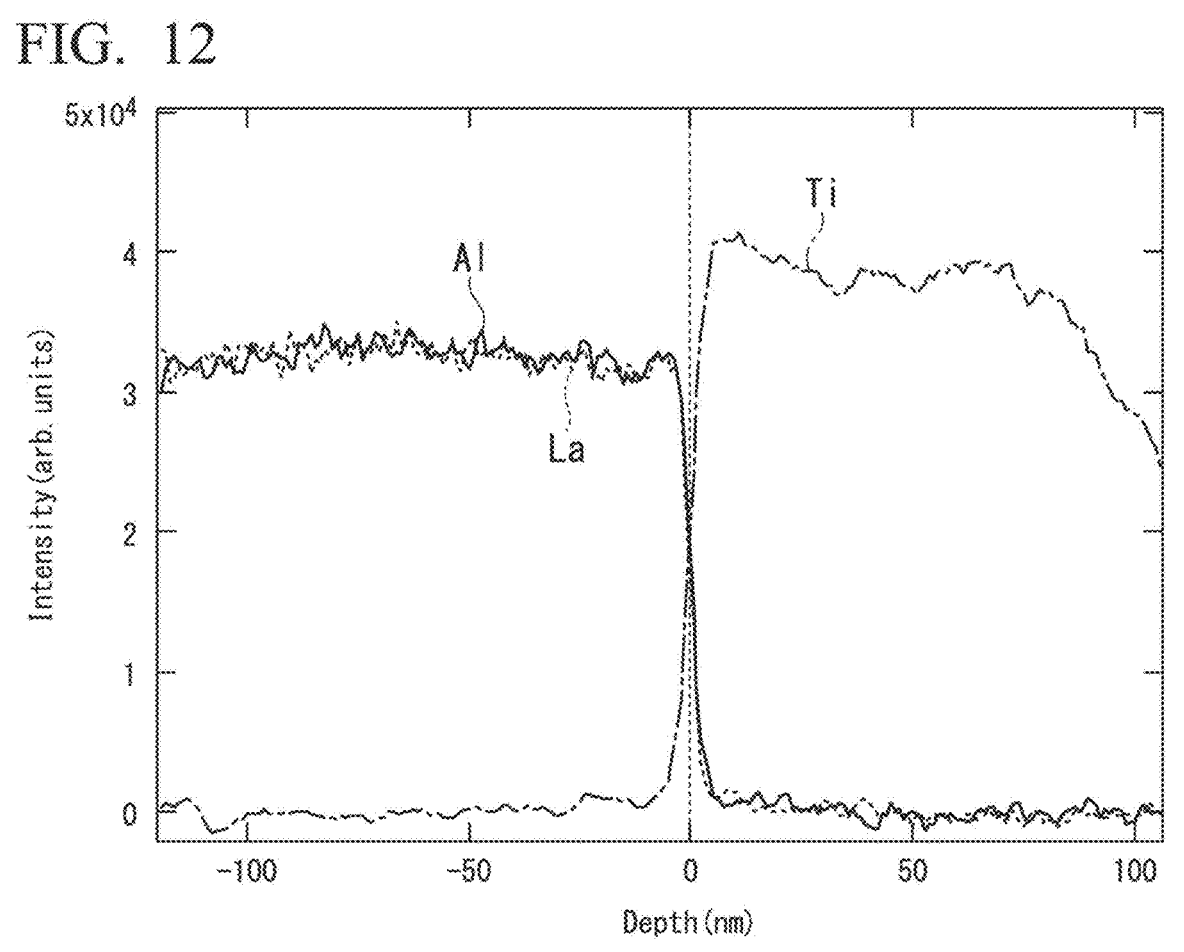
Figure 13:
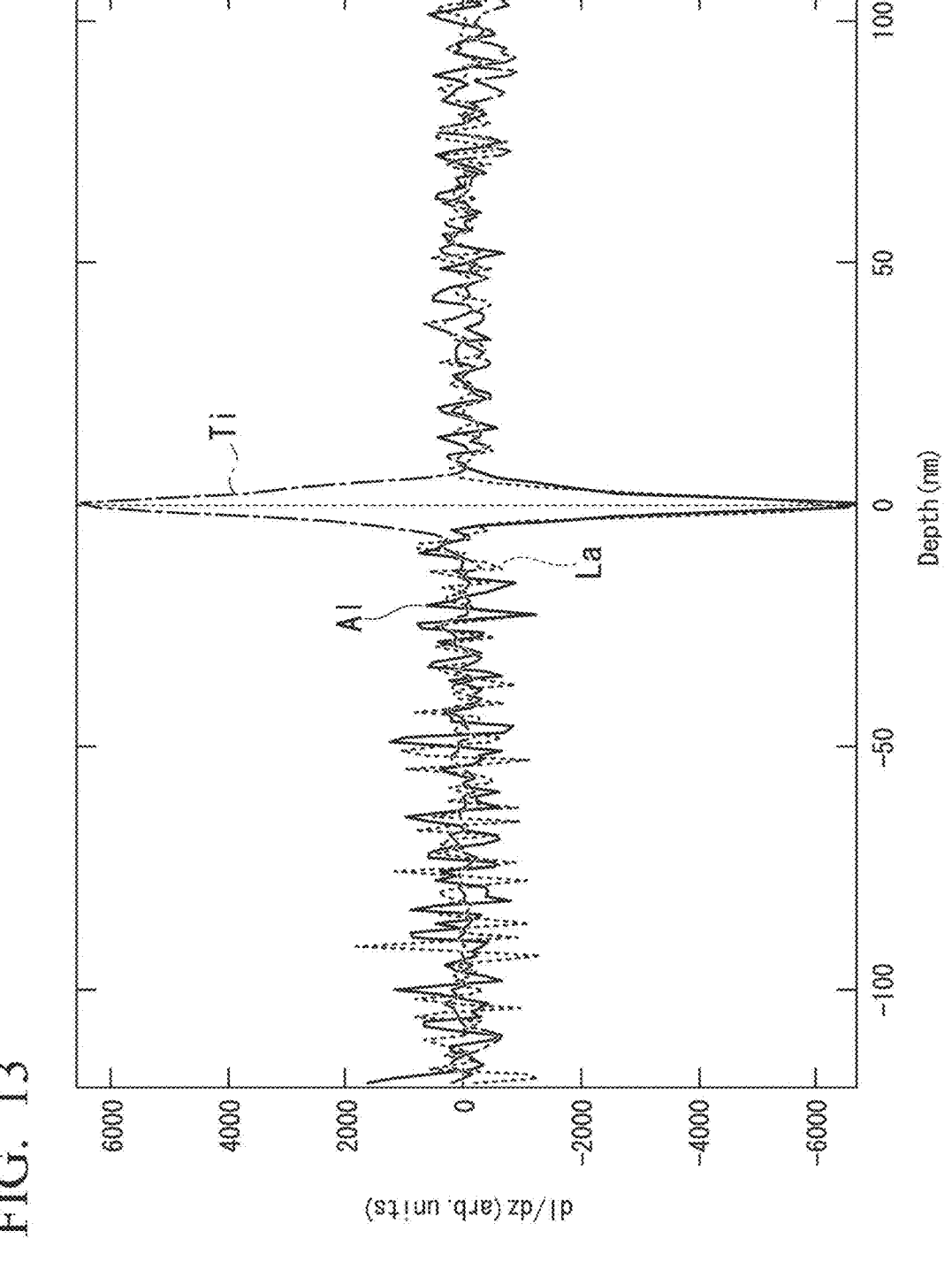
FIG. 13 is a view illustrating a result of differentiating a plot of FIG. 12 at a position.

An EDS spectrum was measured from the support substrate of Example 1 to the $\lambda$-$Ti_3O_5$ film so that an interface between the support substrate and the $\lambda$-$Ti_3O_5$ film is included (a region surrounded by a solid line in FIG. 11). From the obtained EDS spectrum, a plot in which a position where the interface between the support substrate 1 and the $\lambda$-$Ti_3O_5$ film 2 is set to 0 nm is set as the horizontal axis, and an intensity of each constituent element is set as the vertical axis is created (FIG. 12). Next, the intensity of each constituent element was differentiated at a position to obtain a graph shown in FIG. 13. With respect to each peak in FIG. 13, fitting was performed by using the Gaussian function of Expression (1). In addition, a position where 99.9% of the total falls in (0.1% depth position) was calculated from $\sigma$ of each element. When being spaced apart from the interface between the support substrate and the $\lambda$-$Ti_3O_5$ film by 0.1% depth position or more, the element diffusion will be 0.1% or less of the total. Obtained results are shown in Table 2.

TABLE 1

|  | Intensity $A_{203}$ of 203 diffraction peak | Intensity $A_{20\text{-}3}$ of 20-3 diffraction peak | Intensity ratio $A_{203}/A_{20\text{-}3}$ | Intensity ratio $A_{20\text{-}3}/A_{203}$ |
|---|---|---|---|---|
| $\phi0°$ | 17419 | 79 | 220.49 | 0.00 |
| $\phi180°$ | 100 | 13324 | 0.01 | 133.24 |

TABLE 2

|  | $\sigma$(nm) | 0.1% depth position (nm) |
|---|---|---|
| Al | 1.93 | 7.1 |
| La | 1.91 | 6.9 |
| Ti | 2.58 | 9.6 |

FIG. 5 is an XRD pattern of the substrate of Example 1 which was measured at positions of $\phi0°$ and $\phi180°$. The horizontal axis represents a diffraction angle $2\theta(°)$, and the vertical axis represents an intensity. At $\phi0°$, a peak derived from the substrate and diffraction peaks derived from a (202) plane and a (203) plane of the $\lambda$-$Ti_3O_5$ film could be confirmed. Similarly, at $\phi180°$, a peak derived from the substrate and diffraction peaks derived from a (20-2) plane and a (20-3) plane of the λ-Ti₃O₅ film could be confirmed. On the other hand, as illustrated in FIG. 6, in a case of the substrate of Comparative Example 1, since a plurality of peaks are shown, it could be seen that a single phase is not formed and a polycrystalline substance is formed under conditions of Comparative Example 1.

FIG. 7 is a Raman spectrum of the substrate of Examples 1 and λ-Ti₃O₅ nanoparticles. The horizontal axis represents Raman shift (cm⁻¹), and the vertical axis represents an intensity. As shown in FIG. 7, peak positions of the substrate of Example 1 and the λ-Ti₃O₅ nanoparticles match well. An asterisk (*) in FIG. 7 represents a peak derived from LaAlO₃ that is the support substrate, and may not be observed in a Raman spectrum of the λ-Ti₃O₅ nanoparticles. As described above, from FIG. 5 and FIG. 7, it could be confirmed that in the substrate of Example 1, the λ-Ti₃O₅ film is formed. On the other hand, the Raman spectrum of Comparative Example 1 was different from the λ-Ti₃O₅ nanoparticles. From the above, it could be seen that the λ-Ti₃O₅ film is not formed in the substrate of Comparative Example 1 in which the substrate temperature condition deviated. In addition, from Table 1, it could be seen that in the substrate of Example 1, the intensity ratio A₂₀₃/A₂₀₋₃ at a position of ϕ0° is 100 or more, and the intensity ratio A₂₀₋₃/A₂₀₃ at ϕ180° is 100 or more. Accordingly, it could be seen that the substrate of Example 1 has no rotational domain.

FIG. 9 shows element mapping analysis results of Example 1. FIG. 9(a) is a TEM image of the substrate of Example 1. FIG. 9(b) is a mapping image of a Ti K-edge. FIG. 9(c) is a mapping image of an La L-edge. FIG. 9(d) is a mapping image of an Al K-edge. As shown in FIG. 9(a), FIG. 9(b), FIG. 9(c), and FIG. 9(d), La and Al which are components of the substrate did not diffuse into the λ-Ti₃O₅ film. In addition, as shown in Table 2, a value of σ of Al, La, and Ti was 2.6 nm or less. From this, it could be seen that in a region between the position A spaced apart from the interface between the support substrate and the λ-Ti₃O₅ film toward the λ-Ti₃O₅ film by 10 nm in the plate thickness direction, and the position B that is a surface of the λ-Ti₃O₅ film, a ratio of the elements Al and La contained in the support substrate is 0.1% or less, and a component of the support substrate hardly diffuses to the λ-Ti₃O₅ film.

FIG. 10 is a view illustrating a temperature variation in resistivity of the substrate of Example 1. In FIG. 10, the horizontal axis represents a temperature (K), and the vertical axis represents resistivity (Ωcm). "1st" represents a first measurement result, and "2nd" represents a second measurement result. In the substrate of Example 1, in the first measurement, the resistivity varied up to about 350 K, and the variation decreased at 350 K or higher. It is considered that the variation of the resistivity occurred because a phase transition from λ-Ti₃O₅ to α-Ti₃O₅ is initiated. In the second measurement, a variation in the resistivity also occurred similarly. Accordingly, it was confirmed that in the substrate of Example 1, the transition between λ-Ti₃O₅ and α-Ti₃O₅ can be stabilized.

Example 2

A λ-Ti₃O₅ film was formed on the LaAlO₃ (110) substrate by the same method as in Example 1 to obtain a substrate of Example 2 (film thickness: 100 nm).
(Thin Film X-Ray Diffraction Measurement)

Figure 14:
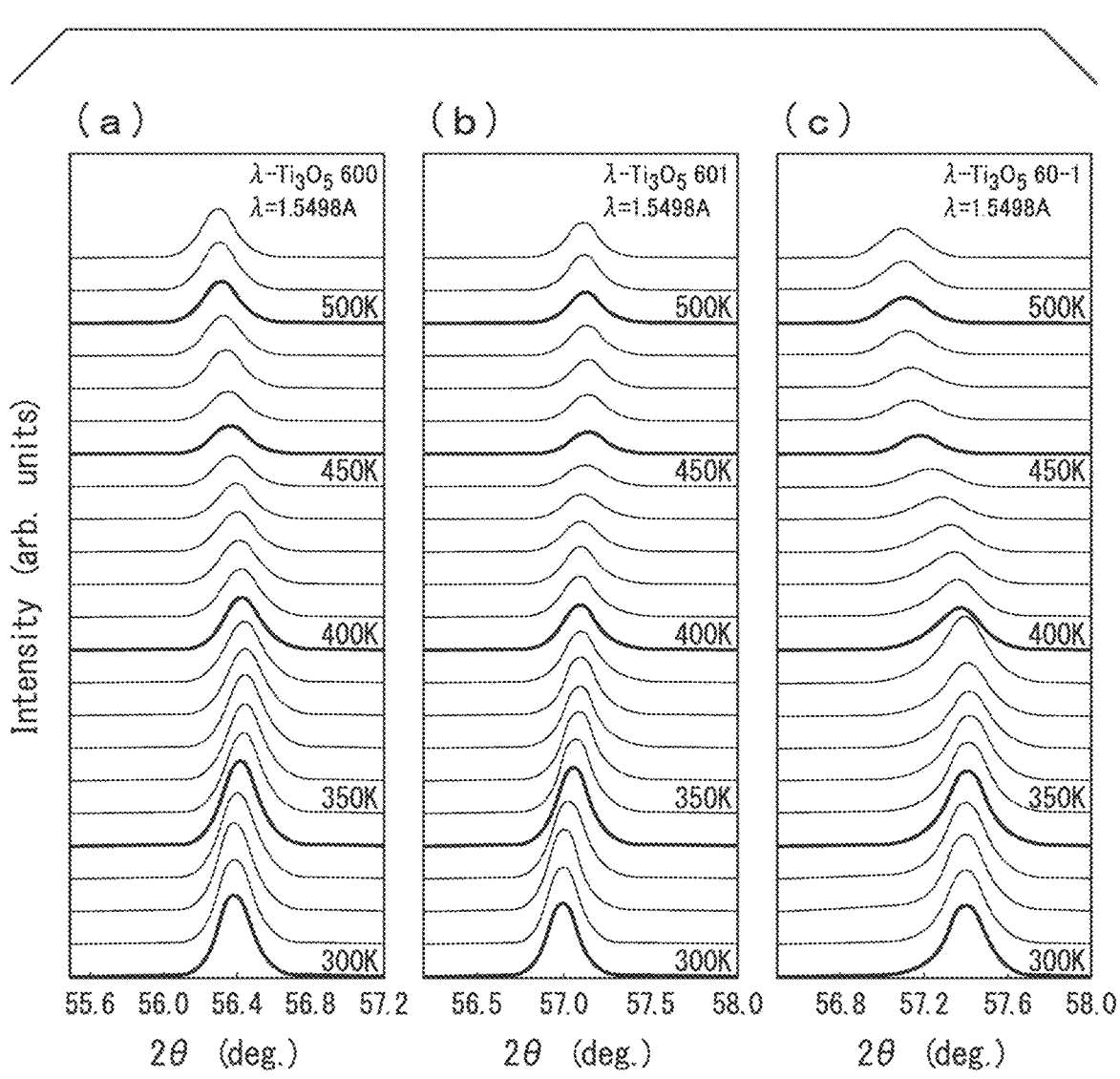
FIG. 14 is an X-ray diffraction analysis result of a (600) plane, a (601) plane, and a (60-1) plane for every temperature in a substrate of Example 2.
Figure 15:
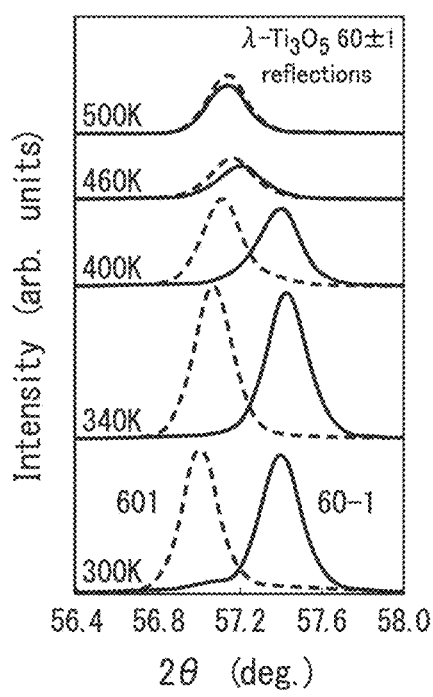
FIG. 15 is a graph illustrating diffraction peaks of the (601) plane and the (60-1) plane at 300 K, 340 K, 400 K, 460 K, and 500 K.

The thin film X-ray diffraction measurement was performed with respect to the substrate of Example 2 by changing a temperature. The thin film X-ray diffraction measurement was performed at an accurate single crystal X-ray diffraction station (BL4C) of synchrotron radiation experimental facility of high energy accelerator research organization (KEK-PF) that is inter-university research institute corporation. Measurement was performed at a temperature from 300 K to 520 K for every 10 K by using a radiation source with energy of 8 keV (wavelength: 1.5498 Å). The substrate of Example 2 was disposed so that a direction of the λ-Ti₃O₅ film and LaAlO₃ [1-10], and a direction in which a direction connecting the X-ray incidence unit and the X-ray detection unit is projected to the λ-Ti₃O₅ film are parallel to each other. Diffraction peak position of a (600) plane, a (601) plane, and a (60-1) plane were investigated. FIG. 14 shows X-ray diffraction peaks of respective diffraction planes at respective temperatures. FIG. 14(a) shows X-ray diffraction peaks of the (600) plane at respective temperatures, FIG. 14(b) shows X-ray diffraction peaks of the (601) plane at respective temperatures, and FIG. 14(c) shows X-ray diffraction peaks of the (60-1) plane at respective temperatures. FIG. 15 shows diffraction peaks of the (601) plane and the (60-1) plane at 300 K, 340 K, 400 K, 460 K, and 500 K.

Figure 16:
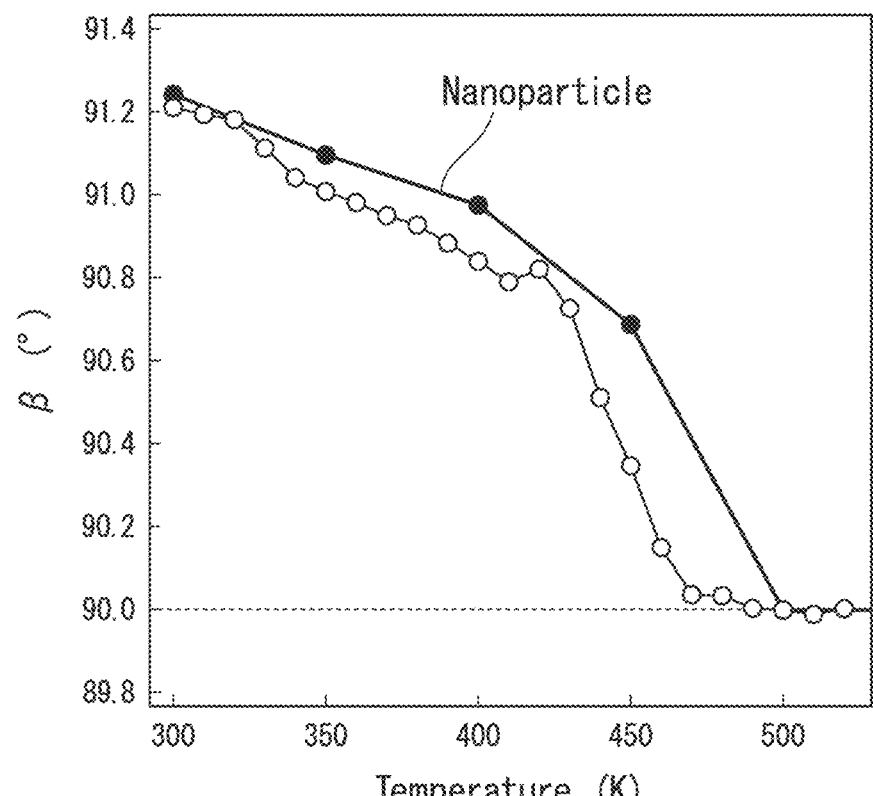
FIG. 16 is a graph obtained by plotting an angle $\beta$ (°) for every temperature.

From X-ray diffraction data of respective diffraction planes at respective temperatures, an angle β of a unit lattice constituting the Ti₃O₅ film was calculated. In the calculation of the angle β, the following Expression (2) was used. In Expression (2), $d_{hkl}$ represents a plane interval of an (hkl) plane, and a, b, and c represent lengths of respective axes of the unit lattice. FIG. 16 shows a graph obtained by plotting the angle β(°) for every temperature. In FIG. 16, a white circle represents calculation results of the angle β in Example 2. In addition, in FIG. 16, a graph obtained by plotting an angle β(°) of λ-Ti₃O₅ nanoparticles for every temperature is also shown with a black circle for reference.

[Mathematical Formula 2]

$$\frac{1}{d_{hkl}^2} = \frac{1}{\sin^2\beta}\left(\frac{h^2}{a^2} + \frac{k^2\sin^2\beta}{b^2} + \frac{l^2}{c^2} - \frac{2hl\cos\beta}{ac}\right) \qquad \text{Expression (2)}$$

As illustrated in FIG. 14, it could be seen that diffraction peak positions by each diffraction plane are different depending on a temperature, and as shown in FIG. 15, as a temperature is higher, a diffraction peak of the (601) plane and a diffraction peak position of the (60-1) plane become closer, and the peak positions match each other at 500 K. In addition, as shown in FIG. 16, the angle β was 90° at 500 K or higher. These results show that monoclinic λ-Ti₃O₅ transitioned to rectangular α-Ti₃O₅ at 500 K.

INDUSTRIAL APPLICABILITY

According to the λ-Ti₃O₅ film forming substrate and the method for producing the λ-Ti₃O₅ film forming substrate according to this embodiment, since direct formation on the substrate is possible, and phase transition from λ-Ti₃O₅ to another phase can occur stably, the invention has high industrial applicability.

REFERENCE SIGNS LIST

1: support substrate
2: λ-Ti₃O₅ film
10: λ-Ti₃O₅ film forming substrate
40: laser
42: target
46: gas inlet port

48: heating unit
49: sample stage
50: vacuum exhaust port
60: vacuum chamber

The invention claimed is:

1. A $\lambda$-Ti$_3$O$_5$ film forming substrate, comprising:
a support substrate; and
a $\lambda$-Ti$_3$O$_5$ film provided directly on the support substrate,
wherein the support substrate consists of a (110) plane LaAlO$_3$.

2. The $\lambda$-Ti$_3$O$_5$ film forming substrate according to claim 1,
wherein in thin film X-ray diffraction, when performing measurement at a position where a diffraction intensity A$_{203}$ of a (203) plane of the $\lambda$-Ti$_3$O$_5$ film becomes maximum, an intensity ratio A$_{203}$/A$_{20\text{-}3}$ between the diffraction intensity A$_{203}$ and a diffraction intensity A$_{20\text{-}3}$ of a (20-3) plane is 10 or more.

3. The $\lambda$-Ti$_3$O$_5$ film forming substrate according to claim 2, wherein in the thin film X-ray diffraction, when performing measurement at a position after the $\lambda$-Ti$_3$O$_5$ film forming substrate is rotated by 180° from the position where the diffraction intensity A$_{203}$ becomes maximum, an intensity ratio A$_{20\text{-}3}$/A$_{203}$ between the diffraction intensity A$_{20\text{-}3}$ and the diffraction intensity A$_{203}$ is 10 or more.

4. The $\lambda$-Ti$_3$O$_5$ film forming substrate according to claim 1,
wherein when a position spaced apart from an interface between the support substrate and the $\lambda$-Ti$_3$O$_5$ film toward a surface of the $\lambda$-Ti$_3$O$_5$ film by 10 nm in a plate thickness direction is set as a position A, and a position of a surface of the $\lambda$-Ti$_3$O$_5$ film is set as a position B, in a region from the position A to the position B in the plate thickness direction, an element X contained in the support substrate is 0.1 atomic % or less with respect to all elements in the $\lambda$-Ti$_3$O$_5$ film.

\* \* \* \* \*